United States Patent
Peschke et al.

(10) Patent No.: US 12,136,930 B2
(45) Date of Patent: Nov. 5, 2024

(54) ANALOG-TO-DIGITAL CONVERTER SYSTEM AND METHOD

(71) Applicant: Rohde & Schwarz GmbH & Co. KG, Munich (DE)

(72) Inventors: Martin Peschke, Vaterstetten (DE); Andrew Schaefer, Oberhaching (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 180 days.

(21) Appl. No.: 17/876,205

(22) Filed: Jul. 28, 2022

(65) Prior Publication Data
US 2023/0082687 A1 Mar. 16, 2023

(30) Foreign Application Priority Data
Sep. 8, 2021 (EP) .................................. 21195426

(51) Int. Cl.
*H03M 1/12* (2006.01)
*H03M 1/06* (2006.01)

(52) U.S. Cl.
CPC ......... *H03M 1/126* (2013.01); *H03M 1/0626* (2013.01); *H03M 1/1215* (2013.01); *H03M 1/1245* (2013.01); *H03M 1/1295* (2013.01)

(58) Field of Classification Search
CPC .. H03M 1/126; H03M 1/0626; H03M 1/1295; H03M 1/1245; H03M 1/1215
USPC ................................................. 341/143, 155
See application file for complete search history.

(56) References Cited

U.S. PATENT DOCUMENTS

| | | | | |
|---|---|---|---|---|
| 6,473,013 B1* | 10/2002 | Velazquez | ........... | H03M 1/1215 341/120 |
| 6,836,235 B2* | 12/2004 | Asami | ................ | H03M 1/0626 341/118 |
| 7,482,956 B2* | 1/2009 | Huang | ................ | H03M 1/1028 341/120 |
| 8,611,483 B2* | 12/2013 | Zhu | ....................... | H04L 7/0334 341/122 |
| 8,836,550 B2* | 9/2014 | Snelgrove | ........... | H03M 1/1033 341/120 |
| 9,325,339 B2* | 4/2016 | Cowley | .................. | H03B 28/00 |
| 9,444,479 B2* | 9/2016 | Dedic | .................... | H03M 1/126 |

(Continued)

FOREIGN PATENT DOCUMENTS
EP 2965434 B1 3/2017

OTHER PUBLICATIONS
William C. Black, Jr., and David A. Hodges, "Time Interleaved Converter Arrays," IEEE Journal of Solid-State Circuits, vol. SC-15, No. 6, Dated Dec. 1980, pp. 1022-1029.

(Continued)

*Primary Examiner* — Khai M Nguyen
(74) *Attorney, Agent, or Firm* — Patterson + Sheridan, LLP

(57) ABSTRACT

The present disclosure provides an analog-to-digital converter system comprising a sampler configured to sample an input signal and provide at least two output signals with a predetermined output sample rate, and an analog-to-digital converter for each one of the output signals and configured to convert the respective output signal into a digital signal with a predetermined converter sample rate, wherein the converter sample rate is higher than the output sample rate. Further, the present disclosure provides a respective method.

18 Claims, 11 Drawing Sheets

(56) References Cited

U.S. PATENT DOCUMENTS

2008/0024347 A1* 1/2008 Choe .................. H03M 1/1215
341/155

OTHER PUBLICATIONS

European Patent Office, Extended European Search Report for Application 21195426.8-1203 dated Feb. 15, 2022.
Gui Ping, "ADCs Approaching 100GSamples/s," TWEPP, 2017, Dated Sep. 15, 2017.

* cited by examiner

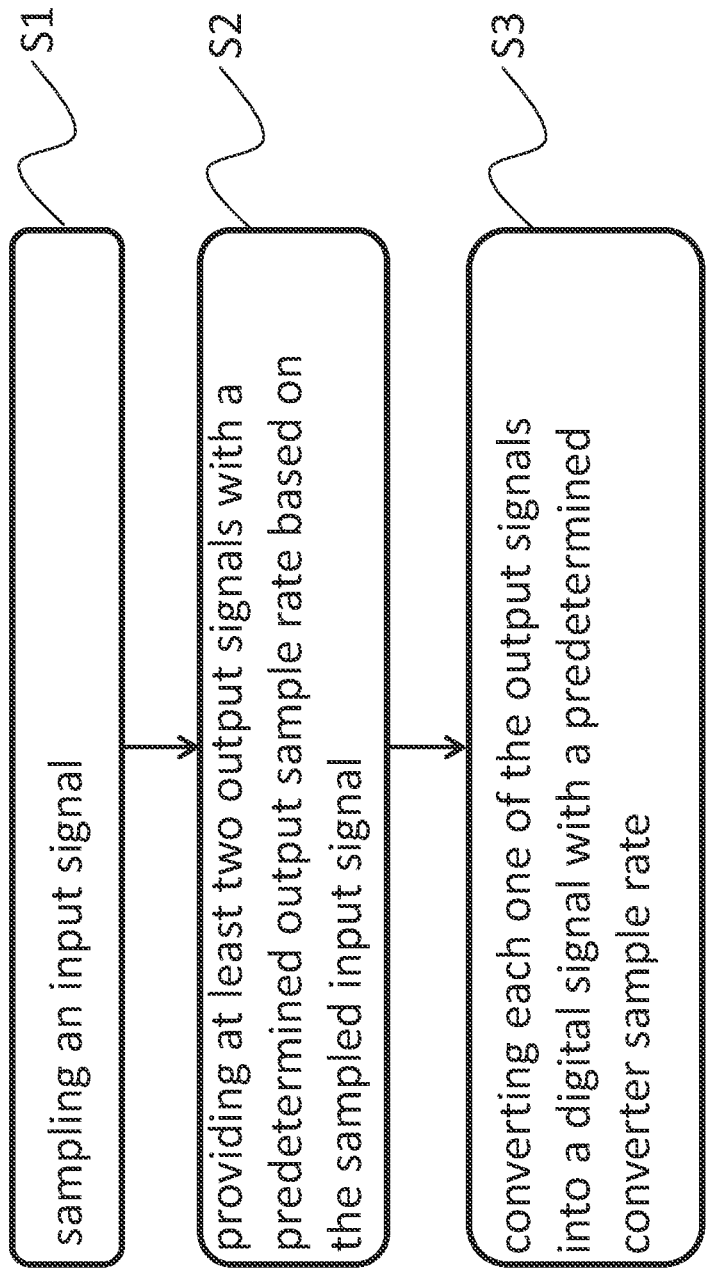

ANALOG-TO-DIGITAL CONVERTER SYSTEM AND METHOD

TECHNICAL FIELD

The disclosure relates to an analog-to-digital converter system and a respective method.

BACKGROUND

Although applicable to any signal processing system, the present disclosure will mainly be described in conjunction with measurement systems for high speed signals.

In modern electronics applications, like for example communication systems, electrical signals with very high frequencies have to be processed. Such signals may in some applications have frequencies in the range of multiple tens of GHz, like for example 60 GHz or more.

During development of electrical devices for such applications, the signals also have to be measured for verifying operation of the respective devices. In order to measure such high-frequency signals with the required precision, single A/D-converters are not available.

Instead, so called time-interleaved systems have been developed as a solution for digitizing high frequency signals. However, common time-interleaved A/D-systems are complex and difficult to design.

Accordingly, there is a need for an improved high-speed signal analog-to-digital conversion.

SUMMARY

The above stated problem is solved by the features of the independent claims. It is understood, that independent claims of a claim category may be formed in analogy to the dependent claims of another claim category.

Accordingly, it is provided:

An analog-to-digital converter system comprising a sampler configured to sample an input signal and provide at least two output signals with a predetermined output sample rate, an analog-to-digital converter for at least one, especially each one, of the output signals configured to convert the respective output signal into a digital signal with a predetermined converter sample rate, wherein the converter sample rate is higher than the output sample rate.

Further, it is provided:

A method for converting analog signals into digital signals, the method comprising sampling an input signal, providing at least two output signals with a predetermined output sample rate based on the sampled input signal, and converting at least one, especially each one, of the output signals into a digital signal with a predetermined converter sample rate, wherein the converter sample rate is higher than the output sample rate.

The present disclosure acknowledges that traditional time-interleaved A/D-converters are complex and difficult to design, while they still provide a sample rate that is much higher than that of the single A/D-converter units used in such traditional time-interleaved A/D-converters.

Usually, in such systems a sampler is used to sample an input signal. In this context a sampler is a means to generate a time discrete signal by taking samples with a certain input sample rate. In contrast to an analog-to-digital converter, these samples are still continuous in value rather than being quantized into digital values.

A sampler in a time-interleaved system usually has a high input sample rate $f\_in$. At its output, the sampler generates n output signals, each with the lower output sample rate $f\_out = f\_in/n$. For example, a sampler with 80 GSa/s input sample rate and 10 GSa/s output sample takes a new sample of the input signal every 12.5 ps, while at each of the 8 sampler outputs a new output signal is generated every 100 ps.

In traditional time-interleaved A/D-converters, the sample rate of the time-interleaved analog-to-digital converters $f\_ADC$ exactly matches the output sample rate of the preceding sampler $f\_out$. That means that for every period of the respective time discrete output signal of the sampler each analog-to-digital converter generates one digital output value.

The drawback of such a design is that when combining sampler and analog-to-digital converter components in a traditional time-interleaved A/D-converter, the components have to be chosen with exactly matching sample rates. This limits the choice of components and hinders the reuse of a component in different systems with different sample rates.

In order to increase flexibility at the time of designing time-interleaved analog-to-digital converters the present invention provides the analog-to-digital converter system according to the present disclosure.

The analog-to-digital converter system comprises a sampler. The sampler samples an input signal and provides at least two output signals with a predetermined output sample rate and a predetermined phase shift with respect to each other. This means that each one of the outputs of the sampler represents the value of the input signal at a different point in time. A sampler with two outputs will therefore alternatingly update the output signals, ideally with a 180° phase shift between them. The above-provided information regarding the sampler in a traditional time-interleaved analog to digital converter also applies to the sampler according to the present disclosure.

The sampler may for example comprise a sample circuit for every output signal, that is periodically updated or provided with the signal value at the respective point in time. Such samplers do not comprise a hold component like in sample-and-hold circuits. A sampler may in a simple form for example, be provided by a switch that consecutively connects an input to different outputs. Of course, other forms of a sampler may also be provided.

The analog-to-digital converter system further comprises an analog-to-digital converter for each one of the output signals, i.e. for each one of the outputs of the sampler. The analog-to-digital converters each convert the respective output signal into a digital signal with a predetermined converter sample rate.

In the analog-to-digital converter system according to the present disclosure, the converter sample rate is higher than the output sample rate. This means that the sampler and the analog-to-digital converters have different sample rates. The analog-to-digital converters therefore perform a kind of "oversampling" of the output signals provided by the sampler on its outputs.

In an embodiment, the sampler and the analog-to-digital converters may share the same clock source. Therefore, the optimal timing for sampling the output signals will not shift. Further, it is possible to automatically monitor whether the current sampling phase of the analog-to-digital converters is the optimum sampling phase or not and adapt the sampling phase accordingly, for example with the signal processor as explained below.

During development of the analog-to-digital converter system it is therefore not necessary to specifically select the sampler and the analog-to-digital converters that comprise the same sample rates from a limited range of available components. Instead, any sampler may be combined with any analog-to-digital converter that has a higher sample rate than the sampler.

Further embodiments of the present disclosure are subject of the further subclaims and of the following description, referring to the drawings.

In an embodiment, the analog-to-digital converter system may comprise a signal processor configured to receive the digital signals and convert the digital signals into rate-modified digital signals with a sample rate that is different than the converter sample rate.

The signal processor may be provided as a dedicated processing element, like e.g. a processing unit, a microcontroller, an FPGA, a CPLD or the like. The processor may at least in part also be provided as a computer program product comprising computer readable instructions that may be executed by a processing element. In a further embodiment, the processor may be provided as addition or additional function or method to the firmware or operating system of a processing element that is already present in the respective application.

In addition, it is understood, that any required supporting or additional hardware may be provided like e.g., a power supply circuitry and clock generation circuitry.

The signal processor in this embodiment may act as a kind of re-sampler that modifies, especially reduces, the sample rate of the digital signal and provides respective rate-modified digital signals.

It is understood, that the down-sampling factor may be flexibly chosen, such that the output sample rate of the rate-modified digital signals may be adapted to the respective application as required.

The signal processor may perform downsampling with any adequate algorithm. The signal processor may for example perform downsampling by an integer factor by applying an anti-aliasing filter to the digital signals and keeping only every n-th sample. As alternative, the signal processor may perform downsampling by any rational factor. To this end, the signal processor may for example resample the digital signals with a higher sample rate, e.g. by interpolating or upsampling the digital signals, and then decimating the digital signals by keeping only every m-th sample. Any other adequate form of adapting the sample rate of the digital signals may also be used.

If the sample rate of the rate-modified digital signals may be adapted with the signal processor as required, any type of analog-to-digital converters may be used in the analog-to-digital converter system that have a higher sample rate than the output sample rate of the sampler.

Therefore, the design and component selection of a respective analog-to-digital converter system is greatly simplified.

The signal processor will filter out high frequency noise components when performing the resampling or rate adjustment. The output of the signal processor therefore have a larger number of bits than the raw output stream of the analog-to-digital converters.

In addition, an analog-to-digital converter system according to the present disclosure may easily be adapted to different applications or requirements by adapting the resampling factor in the signal processor.

The analog-to-digital converter system according to the present disclosure may therefore also be used as a drop-in replacement in existing applications. The number of analog-to-digital converter systems produced may therefore increase, and due to the large number of used components scaling effects may reduce the costs of the components.

In a further embodiment, the sample rate of the rate-modified digital signals may be equal to the output sample rate.

If the signal processor modifies the sample rate of the digital signal such that the rate-modified digital signals have the same sample rate as the output signals provided by the sampler, the output of the analog-to-digital converter system is the same as with a traditional time-interleaved A/D-converter.

At the same time, the design of the analog-to-digital converter system provides the above-mentioned flexibility at the time of choosing the components of the analog-to-digital converter system.

In yet another embodiment, the signal processor may further be configured to perform a sample point adjustment of the digital signals.

As indicated above, in a traditional time-interleaved analog to digital converter, the sample rate of the time-interleaved analog-to-digital converters matches the output sample rate of the preceding sampler. Since the sampler output signals are continuous valued but time discrete, in such converters there is an ideal sampling point for the analog-to-digital converter within the sample period of the sampler output. Usually the ideal analog-to-digital converter sampling phase is the point in time at which the continuous valued sampler output signal reaches its maximum within a sample period. For the best signal-to-noise (SNR) performance, the sampling phase of the analog-to-digital converters in such traditional time-interleaved analog to digital converters has to be adjusted to this ideal value.

The adjustment of the analog-to-digital converter sampling phase in such converters is usually done by means of analog phase shifters that manipulate the phase of the ADC sample clock signal. However, a separate analog phase shifter is needed for each analog-to-digital converter in the system. Such analog phase shifters, however, add jitter. Further, analog phase shifting may have negative side effects on other analog parameters, like e.g. linearity, and crosstalk. In addition, analog phase shifting may also have negative side effects on the digital output stream, like e.g. skipping one output sample. Further, the alignment of the data provided by the single analog-to-digital converters may be complicated.

In a time-interleaved analog to digital converter according to the present disclosure, the analog-to-digital converters comprise a higher sample rate f_ADC than the output sample rate f_out used by the sampler for the output signals. With the signal processor, the digital output streams of the analog-to-digital converters may therefore be phase adjusted to the ideal sampling phase. It is understood, that this phase adjustment may be combined with re-sampling of sample rate adjustment of the data streams to the output sample rate, as indicated above.

The signal processor may for example identify the maximum-valued sample in each output signal for each sampling period of the sampler and align all outputs of the analog-to-digital converters according to the identified maximum-valued sample. For example, the positions of the identified maximum-valued samples may be adjusted to be at the same point in time for all digital signals, i.e. analog-to-digital converter outputs.

In an embodiment, the signal processor may perform an upsampling or interpolation of the digital signals and identify the maximum-valued sample in the upsampled or interpolated signals to align the signals. The time-alignment in such an embodiment may be performed with a higher resolution than the converter sample rate and may, therefore, be more accurate.

In a further embodiment, the signal processor may further be configured to down convert the digital signals.

The signal processor may in such an embodiment implement a digital down-converter (DDC) that converts the output stream provided by the analog-to-digital converters to a lower frequency signal at a lower sampling rate. Such a down conversion may preserve all the information in the frequency band of interest of the original signal. The input and output signals of such a down conversion can be real or complex samples. The signal processor may for example convert from the raw radio frequency or intermediate frequency down to a complex baseband signal.

With a signal processor that may perform such a down conversion the following equipment, especially analysis and measurement equipment, may directly operate on the based band signal, if appropriate.

In another embodiment, the signal processor may further be configured to filter the digital signals, especially with a low-pass filter or a matched-filter.

In this embodiment, the signal processor may implement the function of an equalizer that filters the incoming signal such that the final signal stream has a behavior which is as close to a signal converted with an ideal analog-to-digital converter as possible. This may include equalizing the frequency response of the analog-to-digital converters and filtering noise which is outside of the signal bandwidth.

In a traditional time-interleaved analog to digital converter, the sample rate of the analog-to-digital converters matches the output sample rate of the preceding sampler. For every continuous valued but time discrete output signal of the sampler each analog-to-digital converter generates one digital output value.

In the frequency domain, the maximum frequency that can be present at each sampler output is the Nyquist frequency f_out/2 of the sampler output sample rate f_out. To reconstruct the input signal from the time-interleaved output signals with minimum error, the ideal analog-to-digital converter should have a flat magnitude response and a linear phase response between DC (f=0 Hz) and f_out/2. On the other hand, the sampler will generate spectral noise not only up to f_out/2 but also above the Nyquist frequency. To filter these noise components, the ideal analog-to-digital converter should have zero magnitude response above f_out/2.

However, it is not possible to design a real analog-to-digital converter with an ideal frequency response. A frequency response close to the ideal frequency response up to the Nyquist frequency usually results in the stop band above the Nyquist frequency extending to very high frequencies, and thus folding large noise components into the 1st Nyquist band after sampling. If the stop band above the Nyquist frequency is chosen as small as possible, there will be a significant deviation from the ideal frequency response in the pass band below the Nyquist frequency.

In the analog-to-digital converter system according to the present disclosure, the analog-to-digital converters with a higher converter sample rate f_ADC than the sampler output sample rate f_out are used to convert the sampler output signals to the digital domain. Such analog-to-digital converters comprise analog frequency responses with a much higher bandwidth than the first Nyquist band of the sampler output. Thus, the frequency response of the analog-to-digital converters within the first Nyquist band is close to ideal.

After digitizing, the digital output values of the analog-to-digital converters may therefore be filtered with a low pass filter, especially a digital low pass filter, by the signal processor resulting in a frequency response that is substantially equal to that of an ideal analog-to-digital converter within the first Nyquist band.

The digital values may then also be down-sampled to the sample rate of the sampler output frequency f_out. With this procedure, a flat pass band and minimum noise aliasing can be achieved for the digital signals.

In an embodiment, the signal processor may further be configured to sum at least two samples of each one of the digital signals prior to determining a sample value for the respective rate-modified signal or to integrate each one of the digital signals over a predetermined amount of time prior to determining a sample value for the respective rate-modified signal.

In a traditional time-interleaved analog to digital converter system, the sample rate of the analog-to-digital converters matches the output sample rate of the preceding sampler. For every continuous valued but time discrete output signal of the sampler each analog-to-digital converter generates one digital output value. In such traditional converters a single sample may be taken in each period of the sampler output. By assuring the right sampling phase, a good signal-to-noise ratio may be obtained with a single sample at the maximum of the sampler output signal period.

In the time-interleaved analog to digital converter of the present disclosure, analog-to-digital converters with a higher sample rate f_ADC than the sampler output sample rate f_out are used to convert the sampler output signals to the digital domain. The signal processor may therefore sum two or more samples of each output of the sampler and for each output period of the sampler.

It is understood, that the signal processor may sum all samples of each respective output period or only some samples of each output period. If only a selection of the samples are summed for each output period, the signal processor may for example sum a predetermined number of samples that have the highest sample values, for example the 2, 3, 4, 5, 6, 7, 8, 9 or 10 samples with the highest signal values. As alternative, the signal processor may sum consecutive samples, e.g. 2, 3, 4, 5, 6, 7, 8, 9 or 10 consecutive samples.

The summation may for example be implemented by the signal processor as a matched filter, which allows optimizing the summation function to further improve the signal to noise ratio. Possible filter designs may be taken from communication systems to use filters to optimize the signal to noise ratio of communication signals.

In signal processing, a matched filter may for example be obtained by correlating a known delayed signal, or template, with an unknown signal to detect the presence of the template in the unknown signal. This is equivalent to convolving the unknown signal with a conjugated time-reversed version of the template. A matched filter serves for maximizing the signal-to-noise ratio (SNR) in the presence of additive stochastic noise in a signal.

By summing multiple samples within one output period of the sampler the signal-to-noise ratio of the final digital signal may be improved. Further, there is no need for phase adjustment of the samples, since multiple samples of each output period are used for determining a final sample value.

In yet another embodiment, the signal processor may further be configured to determine the highest signal value and the lowest signal value for at least two samples of the digital signals in each sampling period of the sampler, and to determine a sample value for a respective sample for each one of the digital signals based on the determined highest signal value and lowest signal value.

In a traditional time-interleaved analog to digital converter, the sample rate of the analog-to-digital converters matches the output sample rate of the preceding sampler. For every continuous valued but time discrete output signal of the sampler each analog-to-digital converter generates one digital output value.

For such a setup, usually DC coupling of the analog-to-digital converters is mandatory, because only for a DC coupled analog-to-digital converter, one sample value of each output period of the sampler is sufficient to determine the correct sample value, as the baseline potential is fixed to 0 V.

If in such traditional converters an AC coupling is used, the baseline potential is unknown and depends on the history of the signal, as its long term mean value is forced to zero due to the AC coupling.

To overcome this problem, with the time-interleaved analog to digital converter according to the present disclosure, the fact that the analog-to-digital converters perform an oversampling may be advantageously used.

If more than one sample is taken for each sampler period by the analog-to-digital converters, the unknown baseline can be restored from the measured signal values. If the maximum and the minimum values are determined for each sampler period, the difference between the maximum and the minimum value yields the correct value of the respective sample of the sampler output.

It is understood, that the maximum and minimum value determination may be performed by the signal processor on the raw samples provided by the analog-to-digital converters. At alternative, the maximum and minimum value determination may also be performed on the any of the above-mentioned modified sample streams, for example on the interpolated or upsampled sample stream.

The signal processor may not only use two samples to determine the maximum and minimum values. Instead, the signal processor may use all samples in a signal period of the sampler to determine the maximum and minimum values.

Calculating the difference between the maximum and minimum values may also be referred to as differentiating the sample values in this context.

In a further embodiment, the signal processor may further be configured to perform a static non-linearity correction on the digital signals and/or to perform a dynamic non-linearity correction on the digital signals and/or to perform a droop correction on the digital signals.

The signal processor may for example implement the static non-linearity correction by applying a look-up table to the digital signals provided by the analog-to-digital converters, that corrects the static non-linearities for example of the analog part of the analog-to-digital converter system. The look-up table may simply provide a respective output value, also called corrected value, for each sample value.

The dynamic non-linearity correction may for example be performed by applying dynamic non-linearity correction filters, like for example a Volterra Filter, to the sample stream provided by the analog-to-digital converters.

The signal processor may implement the droop correction for correcting the low frequency response. The droop correction may for example be implemented by a respective FIR or IIR filter.

It is understood, that the signal processor may perform any of the above-mentioned functions alone or in combination and in any adequate order, as required in the respective application.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which:

FIG. 11 shows a flow diagram of an embodiment of a method according to the present invention.

In the figures like reference signs denote like elements unless stated otherwise.

DETAILED DESCRIPTION OF THE DRAWINGS

Figure 1:
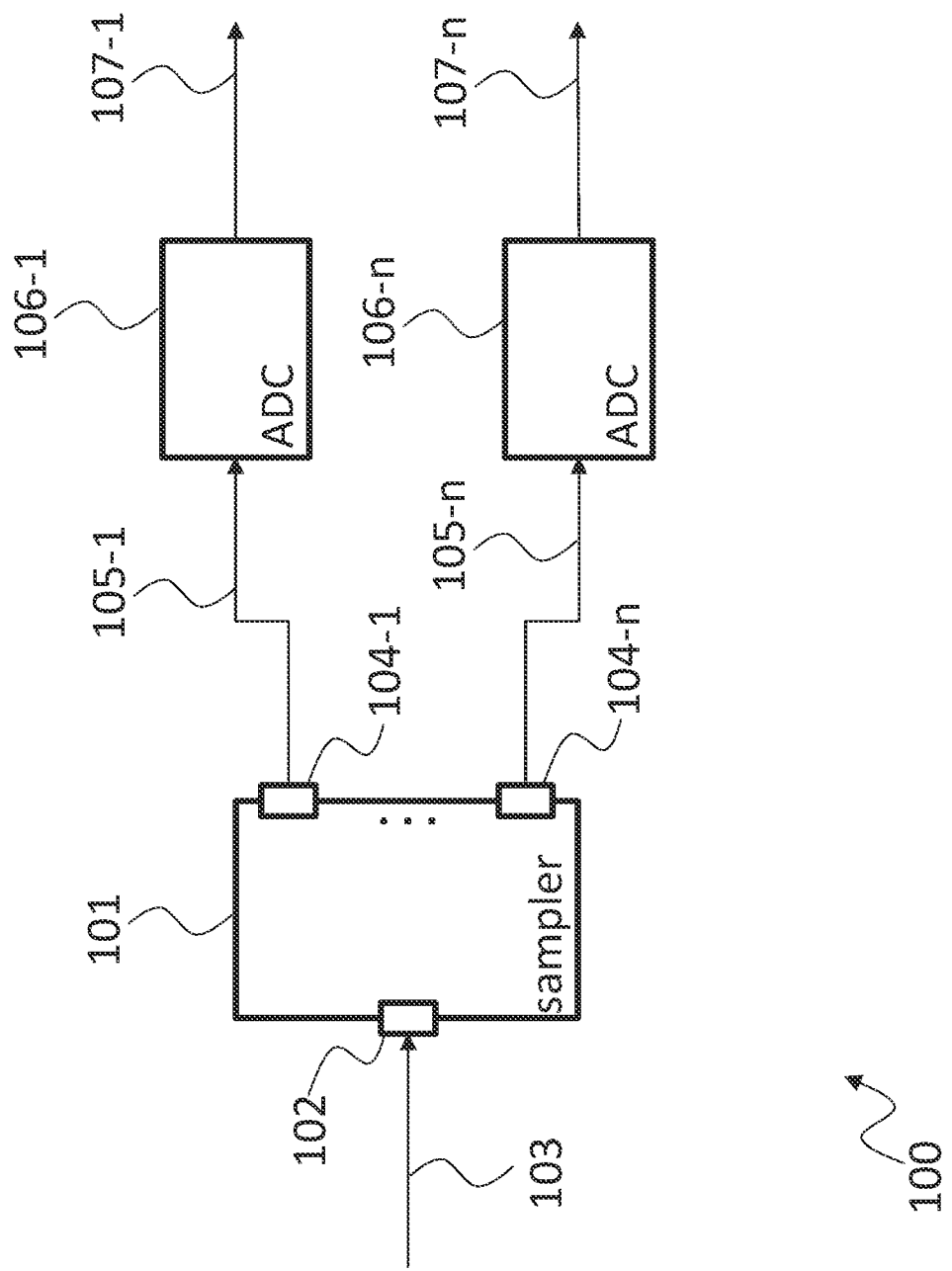
FIG. 1 shows a block diagram of an embodiment of an analog-to-digital converter system according to the present disclosure.

FIG. 1 shows a block diagram of an analog-to-digital converter system 100. The analog-to-digital converter system 100 comprises a sampler 101 with a sampler input 102 and plurality of sampler outputs 104-1, 104-$n$, wherein only two sampler outputs 104-1, 104-$n$ are shown and further sampler outputs are hinted at by three dots. The analog-to-digital converter system 100 further comprises an analog-to-digital converter 106-1, 106-$n$ for every one of the sampler outputs 104-1, 104-$n$. It is understood, that in other embodiments an analog-to-digital converter may be provided for only some of the sampler outputs 104-1-104-$n$.

The sampler 101 samples an input signal 103 and provides a respective output signal 105-1, 105-$n$ on each one of the sampler outputs 104-1, 104-$n$. The sampler 101 provides the output signals 105-1, 105-$n$ with a predetermined output sample rate. As shown for example in FIG. 4, the sampler 101 provides the sampler outputs 104-1, 104-$n$ with a respective phase shift that depends on the number of sampler outputs 104-1, 104-$n$.

The analog-to-digital converters 106-1, 106-$n$ each convert the respective output signal 105-1, 105-$n$ into a digital signal 107-1, 107-n with a predetermined converter sample rate, wherein the converter sample rate is higher than the output sample rate.

The arrangement of the analog-to-digital converter system 100 with the two different sample rates, as already indicated above and further explained below, allows performing a plurality of different functions on the digital signals 107-1, 107-n.

Further the arrangement of the analog-to-digital converter system 100 enables the usage of standard components, which do not have to be chosen with specifically matching sample rates.

Although not shown, optionally a multiplexer may be provided to multiplex the parallel digital signals 107-1, 107-n into a single signal stream.

Figure 2:
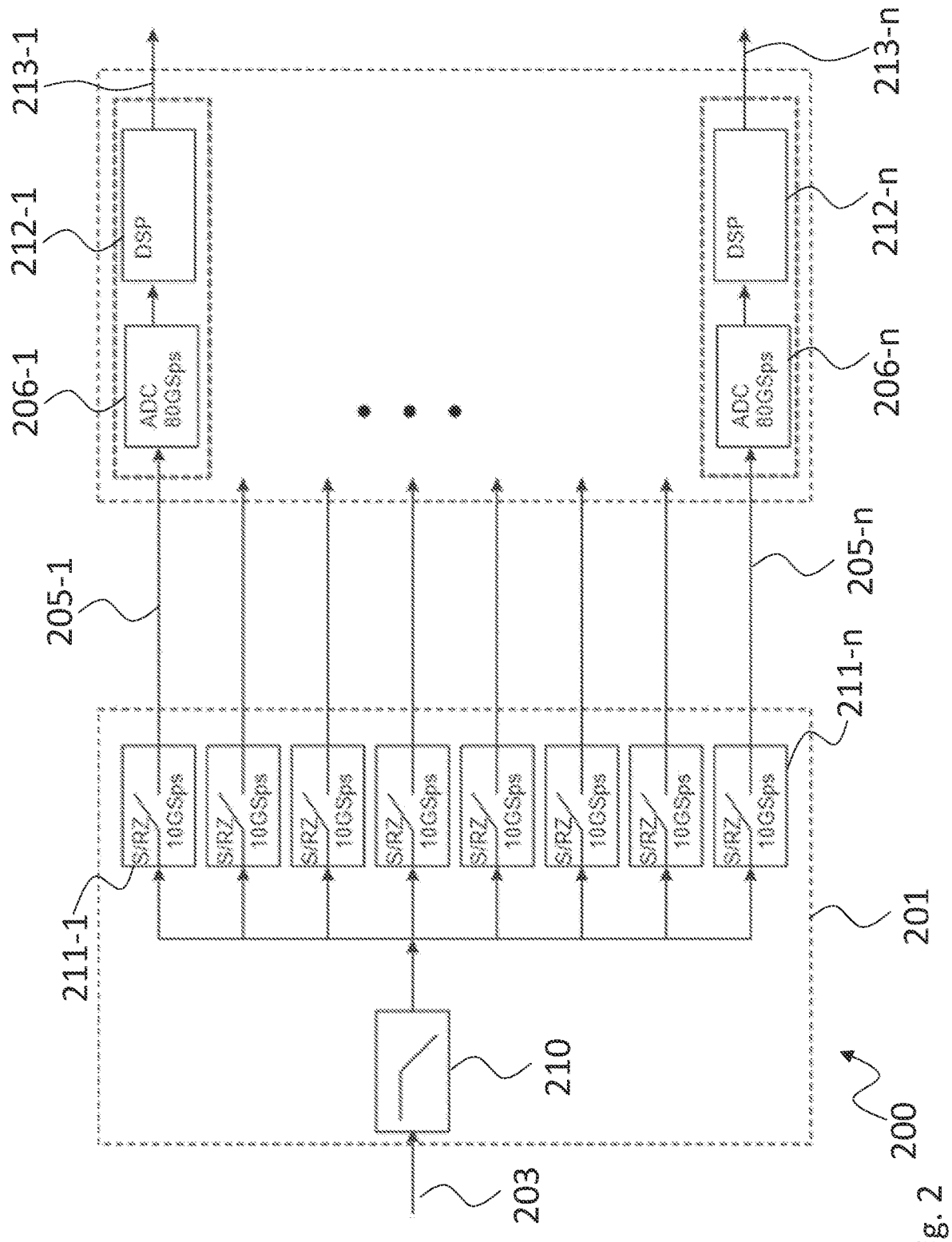
FIG. 2 shows a block diagram of another embodiment of an analog-to-digital converter system according to the present disclosure.

FIG. 2 shows a block diagram of another analog-to-digital converter system 200. The analog-to-digital converter system 200 comprises a sampler 201. The sampler 201 receives an input signal 203 that is provided to a switch 210. The switch 210 consecutively provides the input signal 203 to eight sample 211-1, 211-n. For sake of clarity only the first and last one of the sample 211-1, 211-n are provided with reference signs. It is understood, that the number of eight sample 211-1, 211-n is only exemplarily chosen and that any other number of sample 211-1, 211-n may also be provided.

The analog-to-digital converter system 200 further comprises an analog-to-digital converter 206-1-206-n for every one of the output signals 205-1-205-n, and a signal processor 212-1-212-n for every one of the analog-to-digital converters 206-1-206-n. It is understood, that although single signal processors 212-1-212-n are shown for every analog-to-digital converter 206-1-206-n, a single signal processor with a respective number of signal inputs may also be used.

The sample 211-1-211-n may for example provide an output stream, i.e. the output signals 205-1-205-n, with a sample rate of 10 GSps (Giga-Samples per second). At the same time, the analog-to-digital converters 206-1-206-n may sample the provided output signals 205-1-205-n with a sample rate of 80 Gsps. The signal processors 212-1-212-n may then perform different functions on the digital signals provided by the analog-to-digital converters 206-1-206-n and output respective modified digital signals 213-1-213-n.

The signal processors 212-1-212-n may for example convert the digital signals 207-1, 207-n into rate-modified digital signals 213-1-213-n with a sample rate that is different than the converter sample rate, especially with a sample rate that is equal to the output sample rate of the sampler 201.

The signal processors 212-1-212-n may further perform a sample point adjustment of the digital signals 207-1-207-n. The signal processors 212-1-212-n may also down convert the digital signals 207-1-207-n. Another function of the signal processors 212-1-212-n is to filter the digital signals 207-1-207-n, for example with a low-pass filter or a matched-filter.

In order to increase the signal-to-noise ratio of the modified digital signals 213-1-213-n, the signal processors 212-1-212-n may sum at least two samples of each one of the digital signals 207-1-207-n prior to determining a sample value for the respective rate-modified digital signals 213-1-213-n. Instead of summing, the signal processors 212-1-212-n may also integrate each one of the digital signals 207-1-207-n over a predetermined amount of time prior to determining a sample value for the respective rate-modified signal.

If the analog-to-digital converters 206-1, 206-n are AC coupled, the signal processor 212-1-212-n may also determine the highest signal value and the lowest signal value for at least two samples of the digital signals in each sampling period of the sampler 201, and may determine a sample value for a respective sample for each one of the digital signals based on the determined highest signal value and lowest signal value.

In addition, the signal processors 212-1-212-n may also perform a static non-linearity correction on the digital signals, perform a dynamic non-linearity correction on the digital signals and perform a droop correction on the digital signals.

Figure 3:
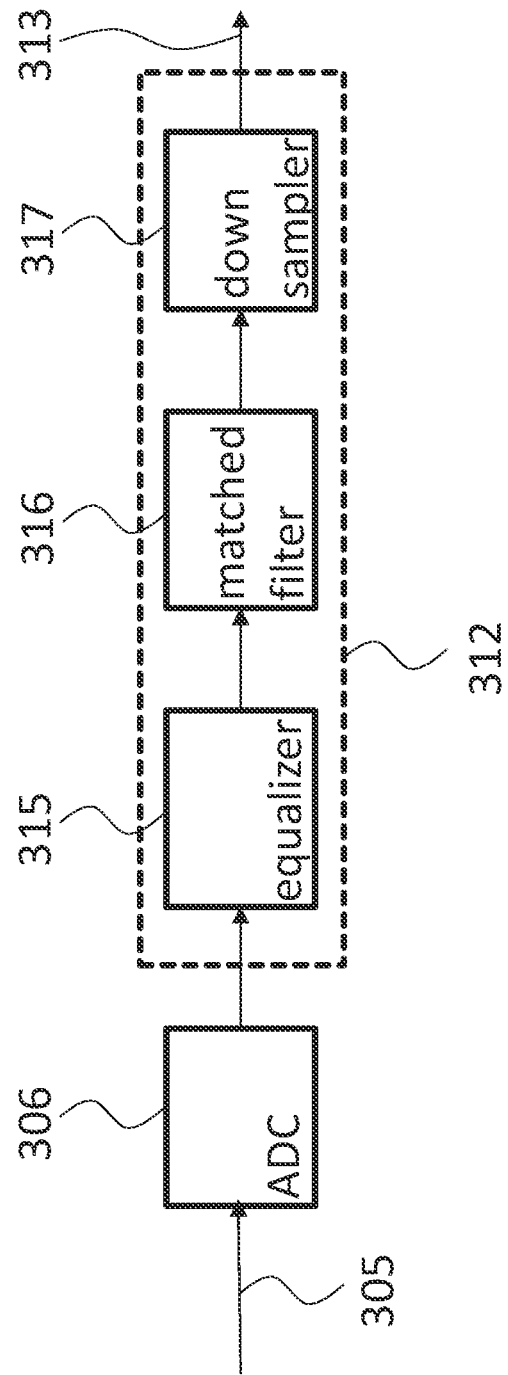
FIG. 3 shows a block diagram of an embodiment of signal path for a single output of the sampler according to the present disclosure.

FIG. 3 shows a block diagram of a possible signal path for a single output of the sampler in an analog-to-digital converter system according to the present disclosure.

The signal path comprises an analog-to-digital converter 306 that receives the output signal 305. The output of the analog-to-digital converter 306 is coupled to a signal processor 312, that comprises an equalizer 315, a matched filter 316 and a down sampler 317 in a series arrangement to provide the modified digital signal 313.

It is understood, that all functions implemented in the signal processor 312 e.g., the equalizer 315, the matched filter 316 and the down sampler 317, may be implemented in hardware, software or a combination of both. The functions may for example be implemented as computer program that is executed by a processing unit like a digital signal processor.

The equalizer 315 may filter the incoming signal such that the signal path has a behavior which is as close to ideal as possible regarding phase and amplitude responses. This may include equalizing the frequency response of the analog-to-digital converter 306 and filtering noise outside of the signal bandwidth.

The matched filter 316 may optimize the SNR of an amplitude modulated waveform. In an exemplary embodiment, the matched filter 316 may find the correct sampling time point as described above, or below in conjunction with FIG. 6. The matched filter 316 may further improve the SNR by summing the received voltage levels per sampling period or, in case of modulated signals being provided as output signal 305, per modulate symbol in order to better utilize the transmitted energy.

Since the analog-to-digital converter 306 performs an oversampling the matched filter 316 may use elements of receiver design in communications engineering to apply a matched filter so that the received SNR is optimized.

Figure 4:
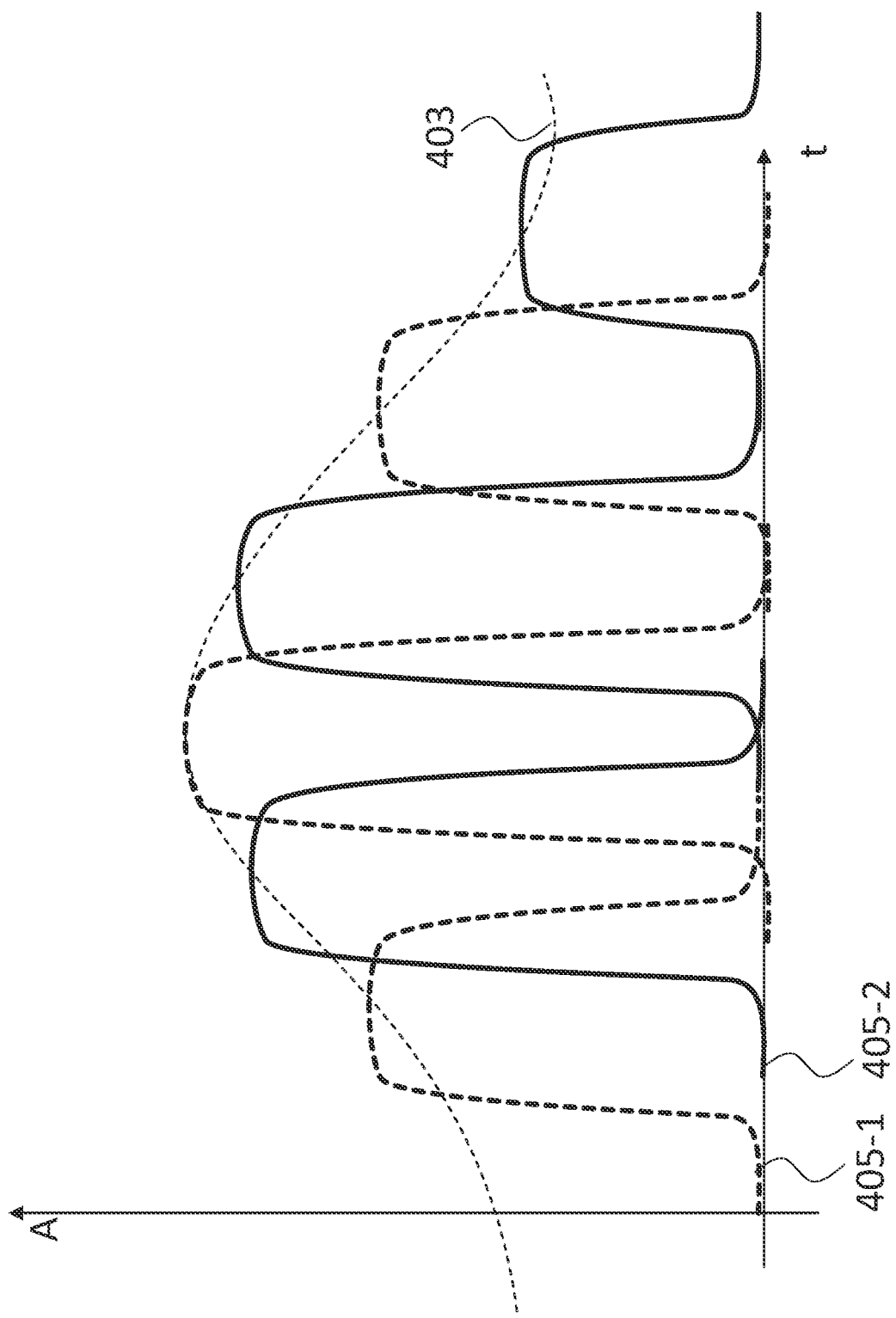
FIG. 4 shows a diagram of an embodiment of an output of a sampler according to the present disclosure.

FIG. 4 shows a diagram of an embodiment of an output of a sampler that may be used in the analog-to-digital converter system according to the present disclosure.

The sampler output is shown for an exemplary sampler with two outputs 405-1, 405-2, i.e. a sampler that alternatingly provides two sampler outputs with the recent value of an input signal 403. It is understood, that the number of two outputs 405-1, 405-2 is only exemplarily chosen and that any other number of outputs is also possible.

It can be seen that the maximum level of every output period matches the value of the input signal 403 at the respective point in time. At the same time, the outputs 405-1, 405-2 are available in parallel and may be converted into digital signals with respective analog-to-digital converters.

Figure 5:
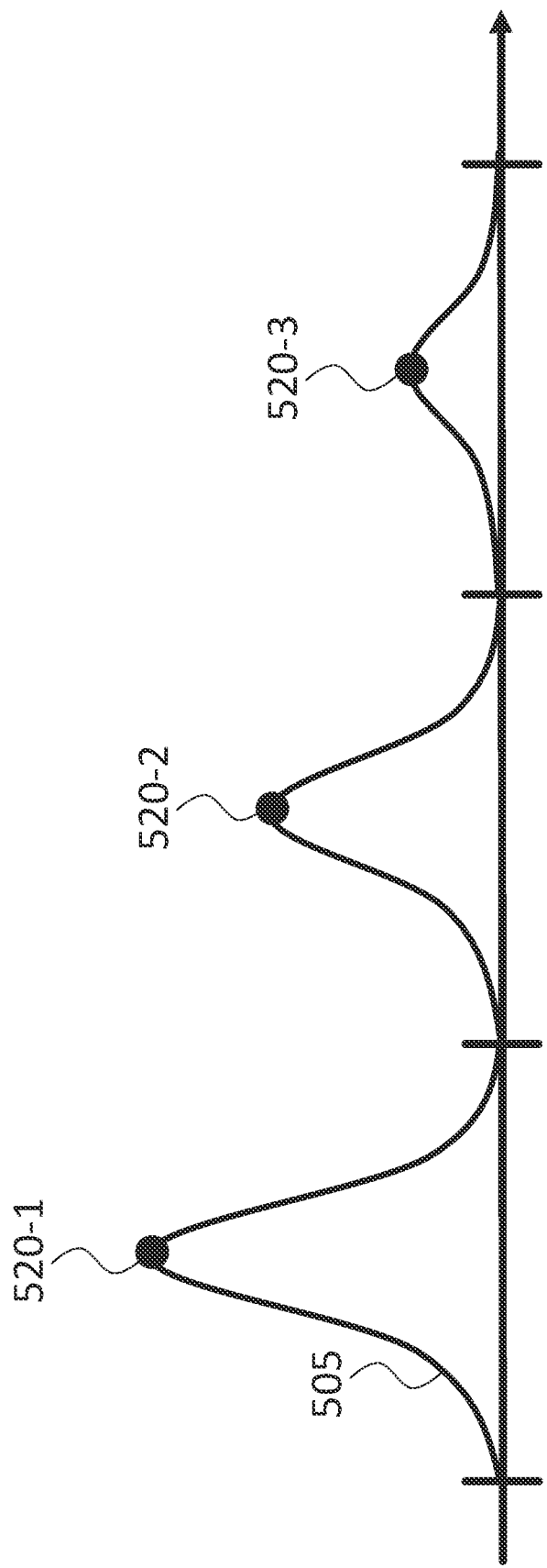
FIG. 5 shows a diagram of an embodiment of an output signal of a sampler and sample points according to a known analog-to-digital converter design.

FIG. 5 shows a diagram of an embodiment of an output signal 505 of a sampler and sample points according to a known analog-to-digital converter design.

Known time-interleaved analog-to-digital converters try to sample the output signal 505 of the sampler with the exact same sample rate as the sampler provides the output signal

505. As already explained above, this requires selected sampler and analog-to-digital converter combinations with matching sample rates.

Further, timing needs to be controlled in such systems, such that the output signal 505 is sampled at the maximum signal value.

Figure 6:
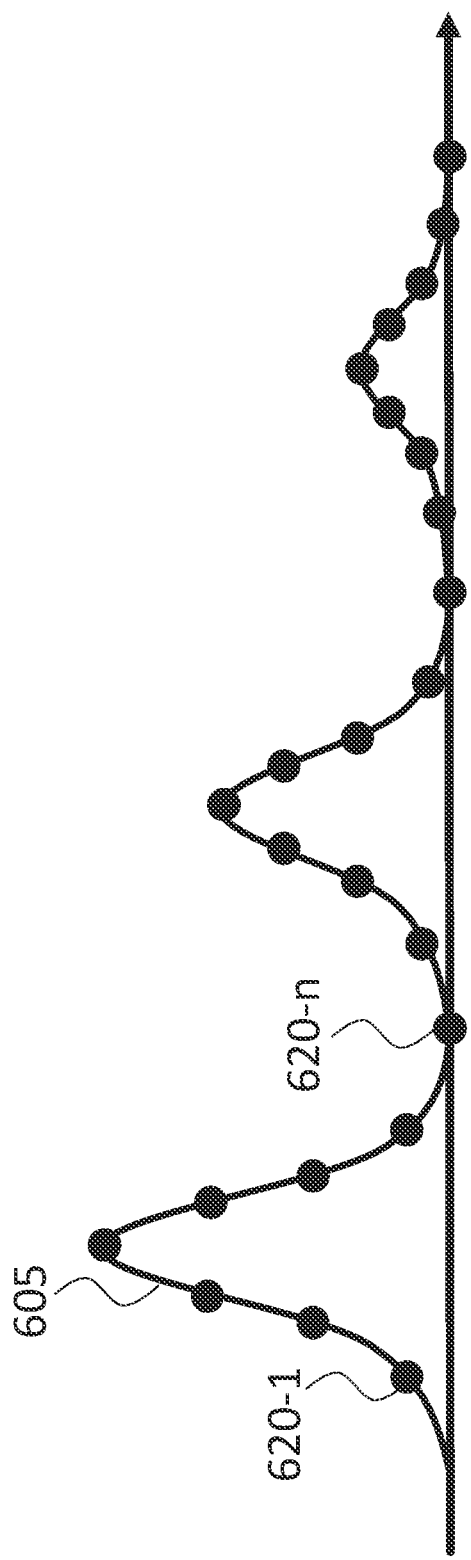
FIG. 6 shows a diagram of an embodiment of an output signal of a sampler and sample points according to an analog-to-digital converter system according to the present disclosure.

FIG. 6 shows a diagram of an embodiment of an output signal 605 of a sampler and sample points 620-1, 620-*n* according to an analog-to-digital converter system according to the present disclosure.

It can be seen that by oversampling the output signal 605, for every signal period of the output signal 605 a plurality of samples are recorded by the analog-to-digital converter at respective or sample points 620-1, 620-*n* in time. It is understood, that although exemplarily eight samples are shown per period in FIG. 6, more or less samples are possible.

In order to be able to restore the output signal 605, the sampling frequency or sample rate of the analog-to-digital converter should be at least twice the rate of the output signal, i.e. two samples should be taken for each period of the output signal 605.

Figure 7:
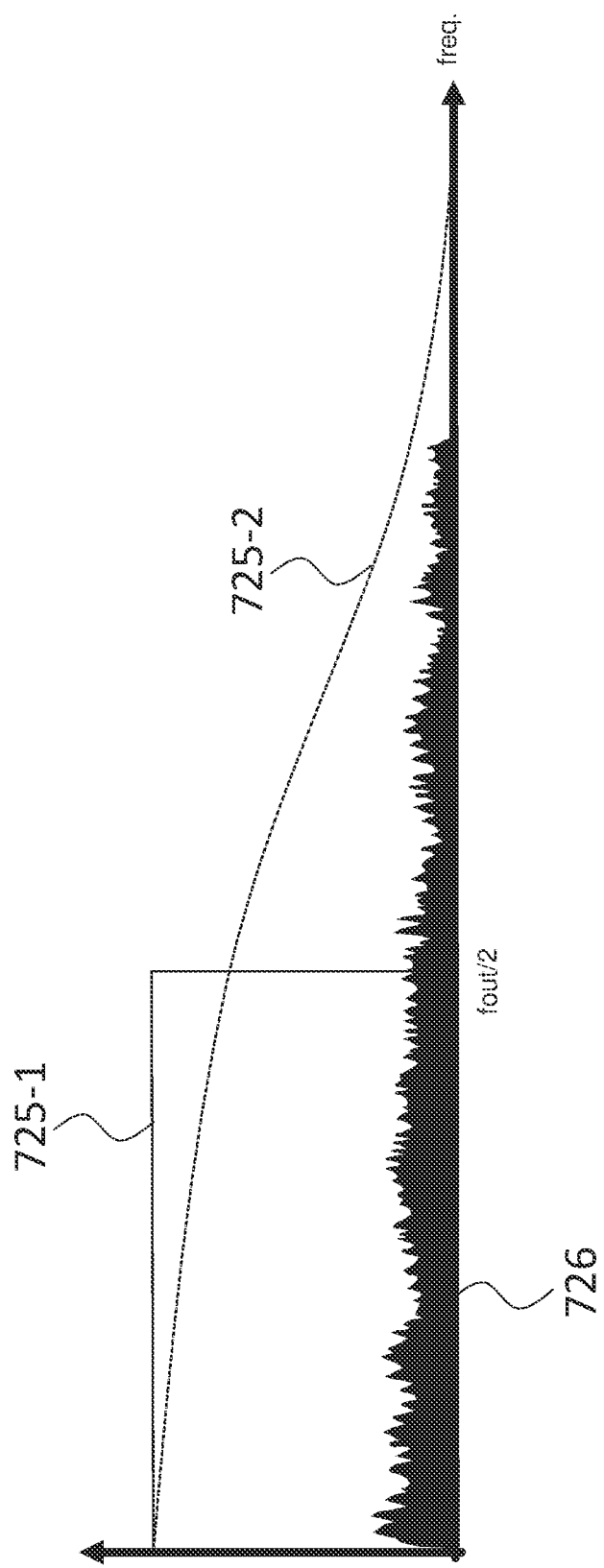
FIG. 7 shows a diagram with a frequency response of a known analog-to-digital converter.

FIG. 7 shows a diagram with a frequency response of a known analog-to-digital converter component as it may be used in traditional time-interleaved analog-to-digital converter designs. The diagram shows the frequency response 725-1 of an ideal analog-to-digital converter and the frequency response 725-2 of a real analog-to-digital converter.

In the frequency domain, the maximum frequency that can be present at each sampler output is the Nyquist frequency f_out/2 based on the sampler output sample rate f_out.

An ideal ADC should have a flat magnitude response and a linear phase response between DC and f_out/2 and the ideal ADC should have zero magnitude response above f_out/2, as shown in the diagram.

However, if a real analog-to-digital converter comprises a frequency response close to the ideal frequency response up to the Nyquist frequency, the stop band above the Nyquist frequency extends to very high frequencies, thus folding large noise components into the 1st Nyquist band after sampling, as can be seen in FIG. 7.

Figure 8:
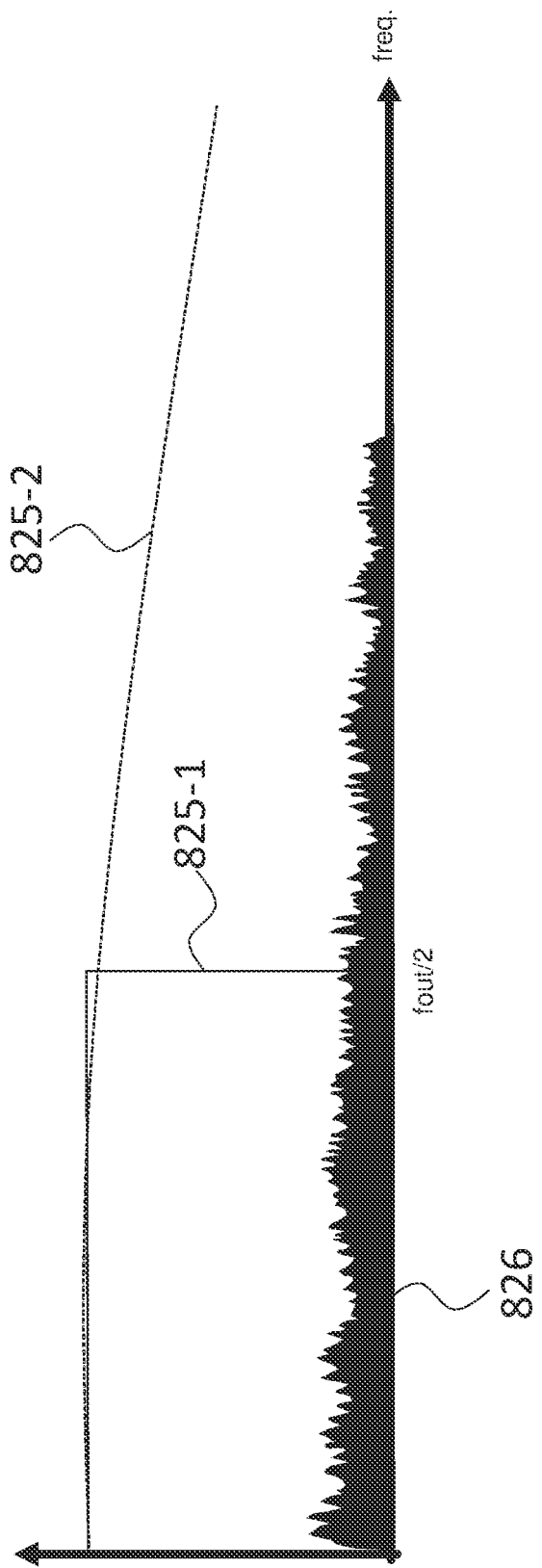
FIG. 8 shows a diagram with a frequency response of an analog-to-digital converter according to the present disclosure.

FIG. 8 shows a diagram with a frequency response of an analog-to-digital converter according to the present disclosure.

The analog-to-digital converters according to the present disclosure has a higher sample rate f_ADC than the sampler output sample rate f_out. Such analog-to-digital converters have an analog frequency response 825-2 with a much higher bandwidth than the first Nyquist band of the sampler output. Thus, the frequency response of the analog-to-digital converters within the first Nyquist band, i.e. up to f_out/2, is close to the ideal frequency response 825-1.

After digitizing, the digital output values of the analog-to-digital converter may then be filtered with a digital low pass filter resulting in a frequency response that is substantially equal to the frequency response 825-1 of an ideal analog-to-digital converter.

In addition, the digital values may also be down-sampled to the sample rate of the sampler output f_out. As result, a flat pass band and minimum noise aliasing can be achieved.

Figure 9:
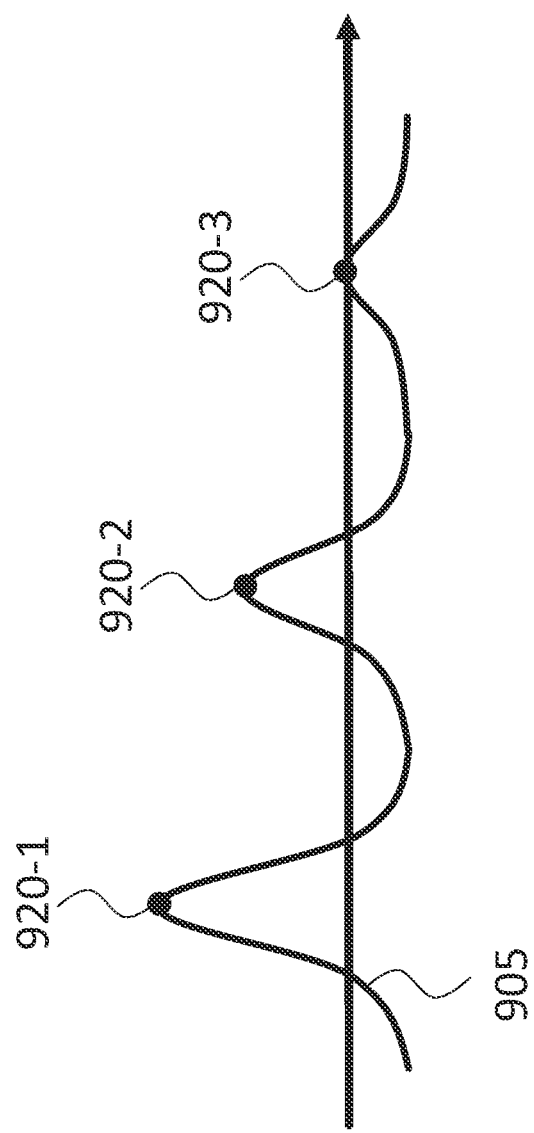
FIG. 9 shows a diagram of an embodiment of an output signal of a sampler and sample points according to a known analog-to-digital converter design.

FIG. 9 shows a diagram of an embodiment of an output signal of a sampler and sample points according to a known analog-to-digital converter design with AC coupled analog-to-digital converters.

In known analog-to-digital converters, only with DC coupling, one sample value of each output signal period of the sampler is sufficient to determine the correct value, as the baseline potential is fixed to 0 V.

If AC coupling was used, the baseline potential would be unknown and would depend on the history of the signal, as its long term mean value is forced to zero due to the AC coupling.

In FIG. 9 it can be seen, that the sample values are not correct, since the base line of the output signal is not known. Especially the last sample point 920-3 is erroneously identified as zero for the AC coupled analog-to-digital converter.

Figure 10:
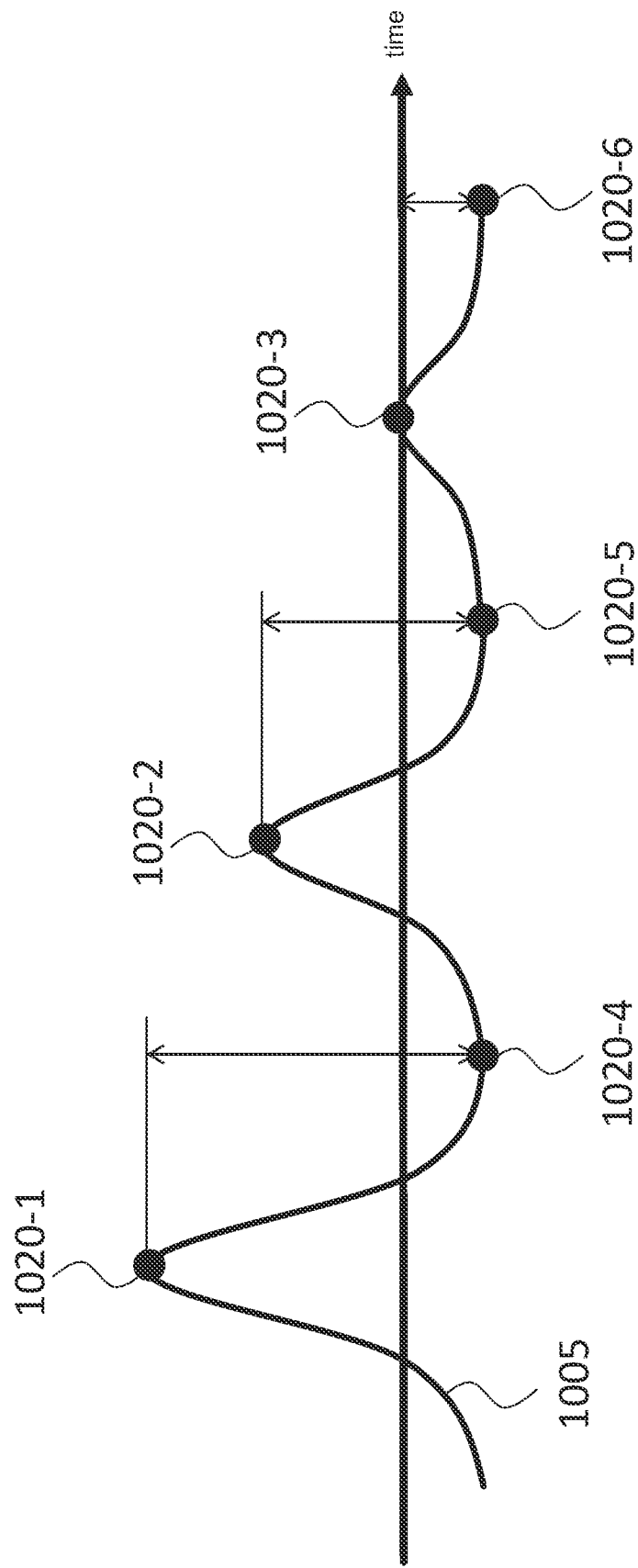
FIG. 10 shows a diagram of an embodiment of an output signal of a sampler and sample points according to an analog-to-digital converter system according to the present disclosure.

FIG. 10 shows a diagram of an embodiment of an output signal 1005 of a sampler and sample points 1020-1-1020-6 according to an analog-to-digital converter system according to the present disclosure.

As indicated above, the analog-to-digital converters in the analog-to-digital converter system perform an oversampling of the output signal 1005. It is therefore possible, to determine the signal value of the output signal 1005 in every output period of the sampler not only based on a single sample point 1020-1-1020-6. Instead, at least two sample points 1020-1-1020-6 may be used. These sample points 1020-1-1020-6 may for example be chosen as the maximum and the minimum value of the output signal 1005 in a respective output period of the output signal 1005.

With sampling multiple sample points 1020-1-1020-6 for every period of the output signal, it is therefore now possible to calculate the amplitude of the output signal 1005, i.e. the difference between the two sample points 1020-1-1020-6, for every period of the output signal 1005 and determine the sample value based on the determined amplitude.

For sake of clarity in the following description of the method based FIG. 11 the reference signs used above in the description of apparatus based FIGS. 1-10 will be maintained.

FIG. 11 shows a flow diagram of an embodiment of a method for converting analog signals into digital signals 107-1, 107-*n*.

The method comprises sampling S1 an input signal 103, 203, 403, providing S2 at least two output signals 105-1, 105-*n*, 205-1, 205-*n*, 305, 505, 405-1, 405-2, 605, 905, 1005 with a predetermined output sample rate based on the sampled input signal 103, 203, 403, and converting S3 each one of the output signals 105-1, 105-*n*, 205-1, 205-*n*, 305, 505, 405-1, 405-2, 605, 905, 1005 into a digital signal 107-1, 107-*n* with a predetermined converter sample rate, wherein the converter sample rate is higher than the output sample rate.

The method may also comprise converting the digital signals 107-1, 107-*n* into rate-modified digital signals 213-1, 213-*n*, 313 with a sample rate that is different than the converter sample rate. The sample rate of the rate-modified digital signals 213-1, 213-*n*, 313 may for example be equal to the output sample rate.

The method may also comprise performing a sample point adjustment of the digital signals 107-1, 107-*n*, down converting the digital signals 107-1, 107-*n*, and/or filtering the digital signals 107-1, 107-*n*, especially with a low-pass filter or a matched-filter.

In order to increase the SNR, the method may also comprise summing at least two samples of each one of the digital signals 107-1, 107-*n* prior to determining a sample value for the respective rate-modified signal, or integrating each one of the digital signals 107-1, 107-*n* over a predetermined amount of time prior to determining a sample value for the respective rate-modified signal.

In order to allow using AC coupled analog-to-digital converters, the method may further comprise determining the highest signal value and the lowest signal value for at least two samples of each one of the digital signals 107-1, 107-n in each sampling period of the output signals 105-1, 105-n, 205-1, 205-n, 305, 505, 405-1, 405-2, 605, 905, 1005, and determining a sample value for a respective sample for the respective one of the digital signals 107-1, 107-n based on the determined highest signal value and lowest signal value.

Other operations that may be performed on the digital signals 107-1, 107-n may comprise performing at least one of a static non-linearity correction on the digital signals 107-1, 107-n a dynamic non-linearity correction on the digital signals 107-1, 107-n, and a droop correction on the digital signals 107-1, 107-n.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

| List of reference signs | |
| --- | --- |
| 100, 200 | analog-to-digital converter system |
| 101, 201 | sampler |
| 102 | sampler input |
| 103, 203, 403 | input signal |
| 104-1, 104-n | sampler output |
| 105-1, 105-n, 205-1, 205-n, 305, 505 | output signal |
| 405-1, 405-2, 605, 905, 1005 | output signal |
| 106-1, 106-n, 206-1, 206-n, 306 | analog-to-digital converter |
| 107-1, 107-n | digital signal |
| 210 | switch |
| 211-1, 211-n | sample circuit |
| 212-1, 212-n, 312 | signal processor |
| 213-1, 213-n, 313 | modified digital signal |
| 315 | equalizer |
| 316 | matched filter |
| 317 | down sampler |
| 520-1, 520-2, 520-3, 620-1, 620-n | sampling point |
| 920-1, 920-2, 920-3 | sampling point |
| 1020-1-1020-6 | sampling point |
| 725-1, 725-2, 825-1, 825-2 | frequency response |
| 726, 826 | noise |
| S1, S2, S3, S4 | method steps |

What is claimed is:

1. An analog-to-digital converter system comprising:
   a sampler configured to sample an input signal and provide at least two output signals with a predetermined output sample rate;
   an analog-to-digital converter for each one of the output signals and configured to convert the respective output signal into a digital signal with a predetermined converter sample rate, wherein the converter sample rate is higher than the output sample rate; and
   a signal processor configured to receive the digital signals and to determine the highest signal value and the lowest signal value for at least two samples of the digital signals in each sampling period of the sampler, and to determine a sample value for a respective sample for each one of the digital signals based on the determined highest signal value and lowest signal value.

2. The analog-to-digital converter system according to claim 1, wherein the signal processor is configured to receive the digital signals and to convert the digital signals into rate-modified digital signals with a sample rate that is different than the converter sample rate.

3. The analog-to-digital converter system according to claim 2, wherein the sample rate of the rate-modified digital signals is equal to the output sample rate.

4. The analog-to-digital converter system according to claim 1, wherein the signal processor is configured to receive the digital signals and to perform a sample point adjustment of the digital signals.

5. The analog-to-digital converter system according to claim 1, wherein the signal processor is configured to receive the digital signals and to down convert the digital signals.

6. The analog-to-digital converter system according to claim 1, wherein the signal processor is configured to receive the digital signals and to filter the digital signals.

7. The analog-to-digital converter system according to claim 1, wherein the signal processor is configured to receive the digital signals and to at least one of sum at least two samples of each one of the digital signals prior to determining the sample value for the respective rate-modified signal or to integrate each one of the digital signals over a predetermined amount of time prior to determining the sample value for the respective rate-modified signal.

8. The analog-to-digital converter system according to claim 1, wherein the signal processor is configured to receive the digital signals and to perform at least one of a static non-linearity correction on the digital signals and a dynamic non-linearity correction on the digital signals and a droop correction on the digital signals.

9. The analog-to-digital converter system according to claim 1, wherein the sampler comprises a switch that consecutively provides the input signal to a plurality of sample circuits.

10. A method for converting analog signals into digital signals, the method comprising:
    sampling an input signal and providing at least two output signals with a predetermined output sample rate based on the sampled input signal;
    converting each one of the output signals into a digital signal with a predetermined converter sample rate, wherein the converter sample rate is higher than the output sample rate;
    determining the highest signal value and the lowest signal value for at least two samples of the digital signals in each sampling period; and
    determining a sample value for a respective sample for each one of the digital signals based on the determined highest signal value and lowest signal value.

11. The method according to claim 10, further comprising:
    converting the digital signals into rate-modified digital signals with a sample rate that is different than the converter sample rate.

12. The method according to claim 11, wherein the sample rate of the rate-modified digital signals is equal to the output sample rate.

13. The method according claim 10, further comprising:
    performing a sample point adjustment of the digital signals.

14. The method according to claim 10, further comprising:
    down converting the digital signals.

15. The method according to claim 10, further comprising at least of one:
    summing at least two samples of each one of the digital signals prior to determining the sample value for the respective rate-modified signal, or
    integrating each one of the digital signals over a predetermined amount of time prior to determining the sample value for the respective rate-modified signal.

16. The method according to claim 10, further comprising:
    performing a static non-linearity correction on the digital signals.

17. The method according to claim 10, further comprising:
    performing a dynamic non-linearity correction on the digital signals.

18. The method according to claim 10, further comprising:
    performing a droop correction on the digital signals.

* * * * *